(12) United States Patent
Tsubakida et al.

(10) Patent No.: US 6,233,819 B1
(45) Date of Patent: May 22, 2001

(54) FINE-PITCH ELECTRODE, PROCESS FOR PRODUCING THE SAME, AND FINE-PITCH ELECTRODE UNIT

(75) Inventors: Hideaki Tsubakida; Koji Toda; Michio Miura, all of Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 09/235,791

(22) Filed: Jan. 22, 1999

(51) Int. Cl.$^7$ .................................................. H05K 3/02
(52) U.S. Cl. ............................ 29/846; 29/825; 29/603.01
(58) Field of Search ............................... 29/846, 603.01, 29/603.02, 603.03, 825

(56) References Cited

FOREIGN PATENT DOCUMENTS

| | | |
|---|---|---|
| 2150715 | * 3/1973 | (DE) . |
| 0415622 | * 3/1991 | (EP) . |
| 2546819 | * 12/1984 | (FR) . |
| 56-130360 | 10/1981 | (JP) . |
| 56-154333 | 11/1981 | (JP) . |
| 57-208267 | 12/1982 | (JP) . |
| 59-111868 | 6/1984 | (JP) . |
| 61-10466 | 1/1986 | (JP) . |
| 61-235163 | 10/1986 | (JP) . |
| 63-30279 | 2/1988 | (JP) . |
| 63-221053 | 9/1988 | (JP) . |
| 63-254058 | 10/1988 | (JP) . |
| 63-296962 | 12/1988 | (JP) . |
| 64-87270 | 3/1989 | (JP) . |
| 64-87271 | 3/1989 | (JP) . |
| 1-308651 | 12/1989 | (JP) . |
| 4-8563 | 1/1992 | (JP) . |
| 4-45960 | 2/1992 | (JP) . |
| 4-49062 | 2/1992 | (JP) . |
| 10-173337 | * 6/1998 | (JP) . |

OTHER PUBLICATIONS

Patent Abstracts of Japan, vol. 13, No. 122 (m–807) '3470!, Mar. 27, 1989 & JP 63 297063 A (Matsushita Electric Ind Co Ltd), Dec. 5, 1988 *abstract*.*

Patent Abstracts of Japan, vol. 13, No. 565 (M–907) '3913!, Dec. 14, 1989 & JP 01 235662 A (Hitachi Ltd), Sep. 20, 1989 *abstract*.*

Patent Abstracts of Japan, vol. 14, No. 71 (M–933) '4014!, Feb. 9, 1990 & JP 01 290453 A (Hitachi Ltd), Nov. 22, 1989 *abstract*.*

Patent Abstracts of Japan, vol. 12, No. 272 (M–724) '3119!, Jul. 28, 1988 & JP 63 054259 A (Matsushita Electric Ind Co Ltd), Mar. 8, 1988 *abstract*.*

Patent Abstracts of Japan, vol. 13, No. 122 (M–807) '3470!, Mar. 27, 1989 & JP 63 296962 A (Hitachi Ltd), Dec. 5, 1988 * abstract*.*

* cited by examiner

*Primary Examiner*—Carl J. Arbes
(74) *Attorney, Agent, or Firm*—Ostrolenk, Faber, Gerb & Soffen, LLP

(57) ABSTRACT

A fine pitch electrode is provided in which fine electrode lines are disposed at even intervals and with high precision, and which has improved productivity and quality. The fine-pitch electrode 11 comprises a plurality of fine electrode lines 12, each of which is coated around its periphery with a coating film which is made of an electrical insulator, and a sealing member 19 in which a plurality of the fine electrode lines 12 are disposed on a plane and which is molded so as to incorporate the fine electrode lines 12.

6 Claims, 6 Drawing Sheets

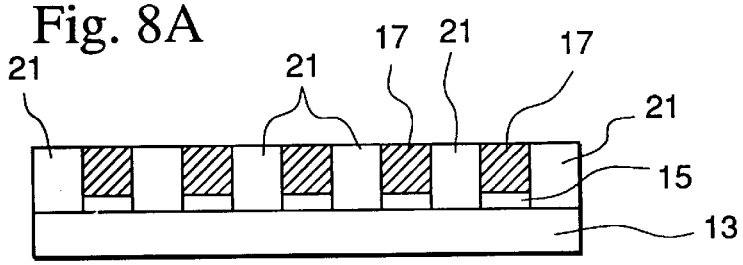
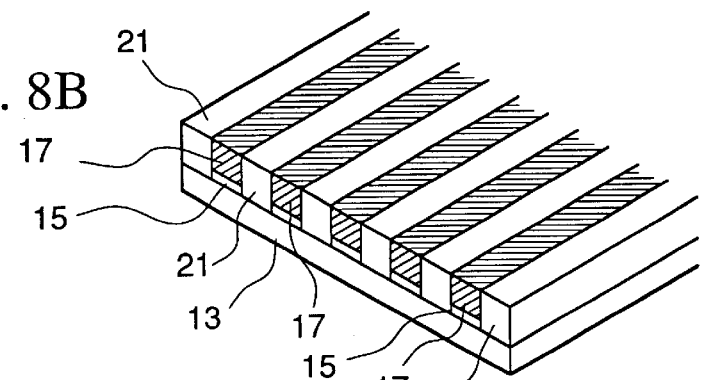
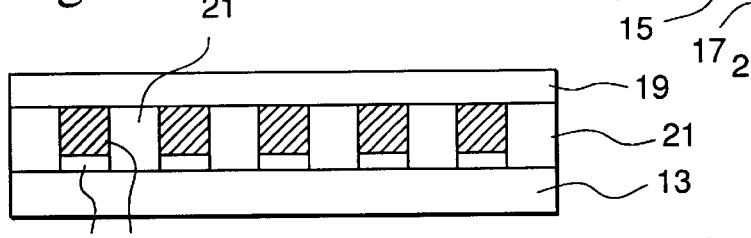
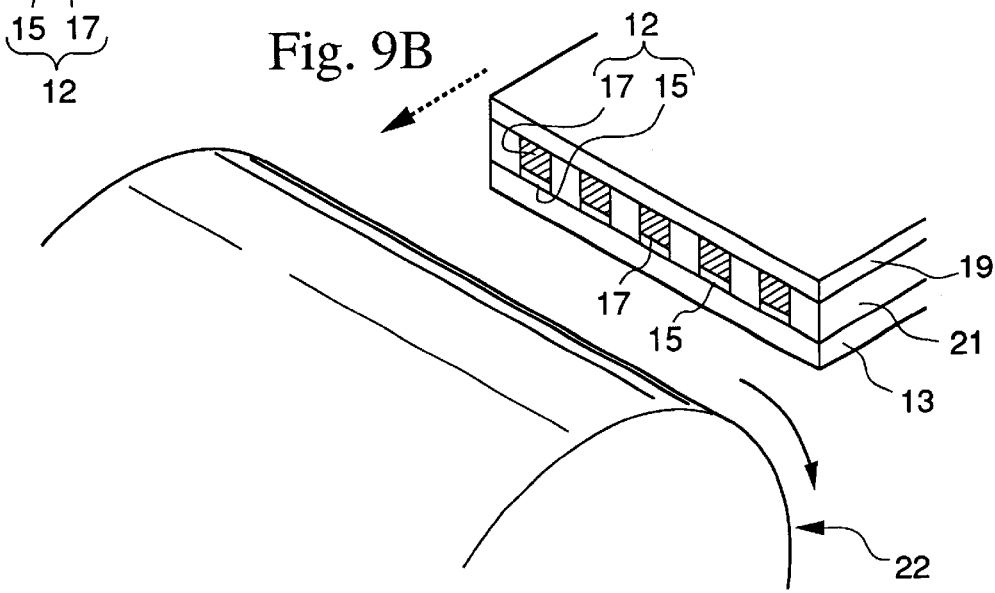

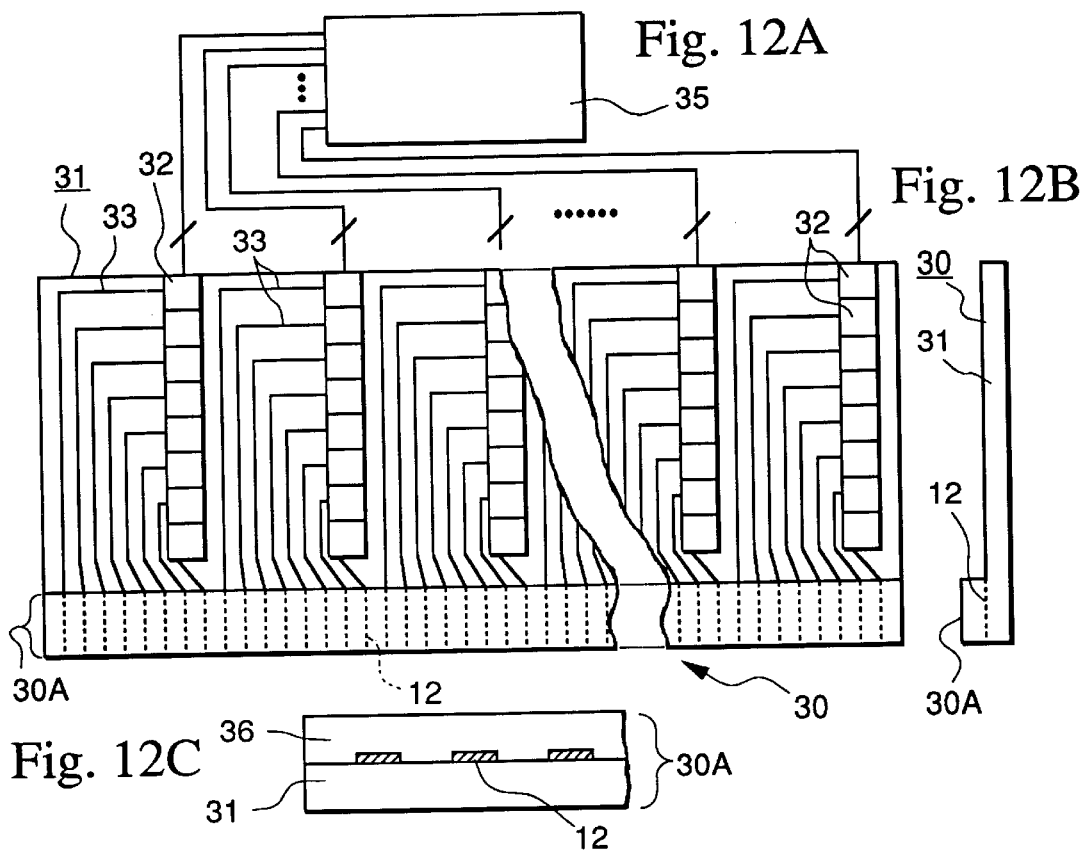
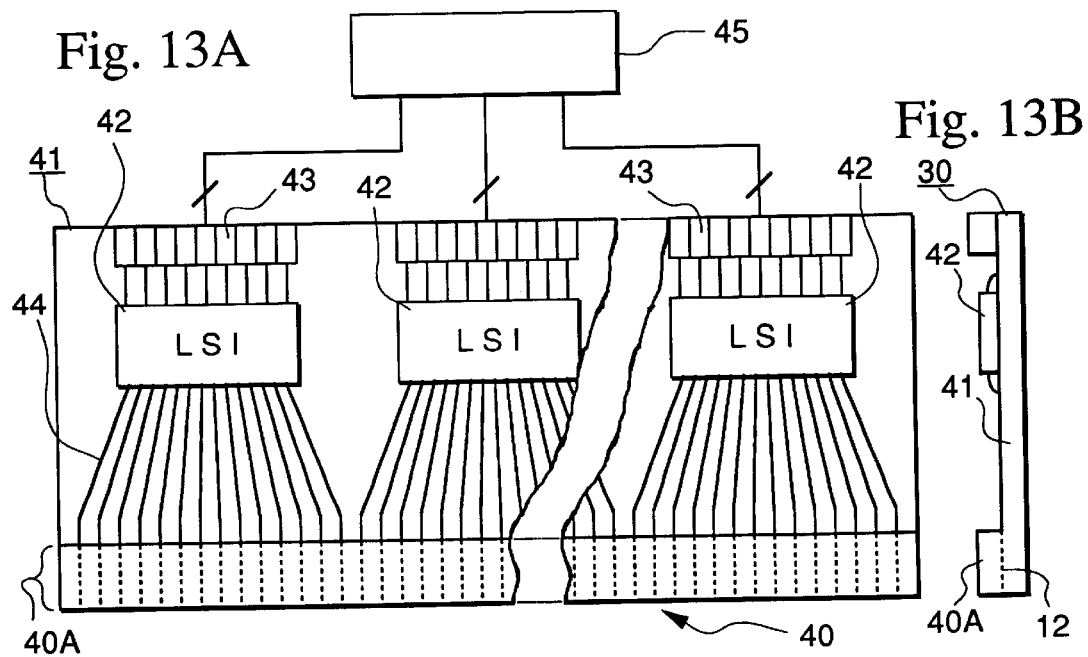

FINE-PITCH ELECTRODE, PROCESS FOR PRODUCING THE SAME, AND FINE-PITCH ELECTRODE UNIT

BACKGROUND OF THE INVENTION

1. Field of the Invention

The present invention relates to fine-pitch electrodes and processes for producing them, and to fine-pitch electrode units. In particular, the present invention relates to fine-pitch electrodes having a structure in which fine electrode lines are disposed in a manner that the end surfaces thereof are aligned with a fine pitch interval and that the end surfaces are disposed on a common plane, and in which electricity can be carried to the fine electrode lines individually.

2. Background Art

High-speed printing systems have recently been developed in which, under a computerized control, an ink film is formed on a rotatable drum, which is made of metallic members, using an electrically conductive ink, then a pattern of characters or the like is formed by causing electricity to run through the ink so as to make the ink coagulate (solidify) to form ink dots, and thereafter the pattern of ink dots is transferred onto a predetermined sheet of paper. An example of the high-speed printing system is shown in FIGS. 15 and 16.

The high-speed printing system shown in FIGS. 15 and 16 is a direct printing system (electronic image formation system), which does not require a printing block. This high-speed printing system has the advantage that clear and uniform printouts can always be printed regardless of the number of printouts.

According to the printing system of this technique, when the ink is made to coagulate (solidify) to form each ink dot d on the rotatable drum 201 by causing electricity to run through the ink, the ink is solidified by making it coagulate to form each ink dot d by the application of instantaneous current between the fine-pitch electrode 101 provided over the rotatable drum 201 and the metallic rotatable drum 201, and thereafter only the solidified pattern is allowed to remain by scraping off the ink portion which has not coagulated since no electricity runs through this portion (image revealing), whereby high-speed image transfer to a predetermined sheet of paper is possible.

In this case, adjacent ink dots d overlap or make contact with each other. On the other hand, when there are blank spaces between ink dots d, fine spaces must be formed between the ink dots d for printing fine characters.

Accordingly, as the fine-pitch electrode 101 which causes the electric coagulation (solidification), one comprising electrode lines 101a having diameters and intervals of micrometer levels is often employed.

FIGS. 14A to 14D show a conventional example of the above-described fine-pitch electrode and a process for producing it. In this example, a copper wire 103 having a diameter of 20 to 200 μm, for example, is wound spirally (at a pitch of 30 to 300 μm) around an acrylic core rod 104 as shown in FIG. 14A. Then, in a position as shown in FIG. 14B, this is immersed in a liquid acrylic resin 105, and the liquid acrylic resin 105 is cured. Then, this is cut along the central dotted line shown in FIG. 14C, and the portion which is shaded in the figure is removed so as to obtain a fine-pitch electrode 101 shown in FIG. 14D.

However, such a fine-pitch electrode 101 is disadvantageous in that when the ink used in the above-described printing system is solidified,. the solvent of the ink evaporates onto the fine-pitch electrode 101 and dissolves the acrylic resin thereof. In addition, since the electrode lines 101a protrude to a large extent, the pitch of the electrode lines 101a is subject to change, which causes displacement of ink dots and results in a large degradation of the precision in image formation. Moreover, when the fine-pitch electrodes 101 are connected to external circuits or the like, each electrode must be properly positioned before they are connected.

SUMMARY OF THE INVENTION

The present invention was devised in view of the disadvantages of the conventional examples. An object of the present invention is to provide: fine-pitch electrodes in which fine electrode lines are set at even intervals and with high precision, and the productivity and quality of which are improved; processes for producing the fine-pitch electrodes; and fine-pitch electrode units.

In order to achieve the above objects, the fine-pitch electrode of the present invention comprises:

a plurality of linear fine electrode lines, each of which is coated around its periphery with a coating film, with an approximately uniform thickness, which is made of an electrical insulator; and a molding member in which a plurality of the fine electrode lines are disposed on a plane and which is molded into a plate, for example, so as to incorporate the fine electrode lines.

Here, by setting the diameter of the coating film of each fine electrode line to be almost the same as the pitch intervals of the fine electrode lines, highly precise and even distances between the fine electrode lines can be provided.

In addition, according to the above-described fine-pitch electrode, by simply disposing the fine electrode lines having the coating films with no space between them, the fine electrode lines can be set at even intervals and with high precision, without necessitating any skill.

Another fine-pitch electrode of the present invention comprises:

an electrically insulating substrate such as a glass substrate;

fine electrode lines each of which comprises a fine electrode film and a laminate electrode film, wherein the fine electrode films are strips of electrically conductive thin films having a predetermined thickness and are disposed on the substrate at predetermined intervals, and the laminate electrode films are electrically conductive members with which the fine electrode films are laminated;

an electrical insulator which fills the spaces between the fine electrode lines; and a sealing member with which the substrate is laminated and the entirety of the upper surfaces of both electrical insulators and the fine electrode lines is covered.

Such fine-pitch electrodes make an automated production process therefor practicable as will be explained below, and not only uniformity of quality and improvement in precision are expected, but fine-pitch electrodes of high quality can be produced in large quantities at a low cost.

A process for producing a fine-pitch electrode according to the present invention comprises:

a thin film formation step in which an electrically conductive thin film base is formed on a substrate using a material with good electrical conductivity such as copper;

a step of forming a mask made of a resist film having openings at predetermined intervals, whereby a plurality of recesses are formed, each of which is defined by the inside surface of the opening and the upper surface of the electrically conductive thin film base;

a plating layer formation step in which a plating layer comprising a metallic material is formed by plating on the electrically conductive thin film base at the bottom of each recess by filling up the recess;

a resist film removal step in which the resist film is removed after the plating layer formation step;

a thin film partial removal step, in which after the resist film removal step the electrically conductive thin film is removed leaving the electrically conductive thin film portions under the plating layers, so as to form a plurality of fine electrode lines each of which comprises the plating layer and the electrically conductive thin film portion;

an insulating material application step in which an electrically insulating material is applied between a plurality of the fine electrode lines; and a fine electrode line sealing-in step in which, after completion of or at the same time as the insulating material application step, an electrically insulating sealing member is molded to cover the entirety of the fine electrode lines except for the surface of one longitudinal end at the tip and a part of the other end portion of each fine electrode line, so as to seal in the fine electrode lines.

Such a process for producing a fine-pitch electrode makes it possible to automate each production step. In addition, according to this process for producing a fine-pitch electrode, uniformity of quality can be maintained, and increase in productivity is expected.

The above-described step of forming a mask may comprise:

a resist application step in which a resist is applied with a predetermined thickness to the electrically conductive thin film base; and an exposure-development step in which an image is developed by exposing the resist to light through a photomask in the shape of a grating having lines which have predetermined widths and which are disposed at predetermined intervals, whereby a resist film having a plurality of openings each of which has a width corresponding to the width of a fine electrode line is formed.

Another process for producing a fine-pitch electrode according to the present invention comprises:

a thin film formation step in which an electrically conductive thin film base is formed on a substrate using an electrically conductive material;

an insulating layer formation step in which an electrically insulating layer having a predetermined thickness is formed on the electrically conductive thin film base;

an excision step in which some portions of the electrically insulating layer are excised using a cutting means through a mask member in the shape of a grating having lines which have predetermined widths and which are disposed at predetermined intervals, so as to form a plurality of recesses, each of which is defined by the inside surface of each excised portion and the upper surface of the electrically conductive thin film base;

a plating layer formation step in which a plating layer comprising a metallic material is formed by plating on the electrically conductive thin film base at the bottom of each recess by filling up the recess;

an insulating layer removal step in which the electrically insulating layer is removed after the plating layer formation step;

a thin film partial removal step, in which after the insulating layer removal step the electrically conductive thin film is removed leaving the electrically conductive thin film portions under the plating layers, so as to form a plurality of fine electrode lines each of which comprises the plating layer and the electrically conductive thin film portion;

a second insulating layer formation step in which second electrically insulating layers are formed between a plurality of the fine electrode lines; and a fine electrode line sealing-in step in which, after completion of or at the same time as the second insulating layer formation step, an electrically insulating sealing member is molded to cover the entirety of the fine electrode lines except for the surface of one end at the tip and a part of the other end portion of each fine electrode line, so as to seal in the fine electrode lines.

A fine-pitch electrode unit according to the present invention comprises:

a printed circuit board;

a fine-pitch electrode which is provided at an end of the printed circuit board, and which has a plurality of fine electrode lines, the end surfaces of which are uncovered and aligned;

connectors which are provided on the printed circuit board, and which receive external driving currents for the fine electrode lines; and printed wiring which electrically connects the fine electrode lines and the connectors in an individually operable manner;

wherein the fine-pitch electrode comprises:

fine electrode lines each of which comprises a fine electrode film and a laminate electrode film, wherein the fine electrode films are strips of electrically conductive thin films having a predetermined thickness and are disposed on the printed circuit board at predetermined intervals, and the laminate electrode films are electrically conductive members with which the fine electrode films are laminated; and a sealing member with which the printed circuit board is laminated so as to fill the spaces between the fine electrode lines and cover the entirety of the fine electrode lines.

In the above fine electrode unit, each fine electrode line may have the cross-sectional shape of a rectangle or a polygon.

Here, the above fine-pitch electrode unit may also comprise:

an electrode driving circuit, such as an LSI, which is provided on the printed circuit board, and which drives the fine electrode lines in response to external driving commands; and connectors which are provided on the printed circuit board, and which receive the external driving commands.

Accordingly, this fine-pitch electrode unit has the functions and effects of the above-described fine-pitch electrode unit. In addition, this fine-pitch electrode unit does not require an operation of connecting the fine-pitch electrode and the printed circuit board, and thus the operability during maintenance or the like of the electrode driving circuit (signal processing circuit) or the like such as an LSI can be improved.

With the fine-pitch electrode according to the present invention, since each fine electrode line is provided with a coating film, the coating films function effectively in that the fine electrode lines can be set at even intervals and with high precision by simply disposing the fine electrode lines with no space between them, without necessitating any skill. Because of this structure, the productivity, the quality, and the durability of the fine-pitch electrode can be greatly improved.

According to the process for producing a fine-pitch electrode, since the fine electrode lines are formed step by step and consecutively by such techniques as sputtering on the electrical insulator such as a glass substrate, exposure-development of resist layer, plating, ion etching, and the like, and since the electrically insulating material is applied between the fine electrode lines and seals in the entirety of the fine electrode lines, the fine-pitch electrodes can be produced automatically and continuously. At the same time, the fine electrode lines in the fine-pitch electrode can be formed to have arbitrary widths and mutual distances. Furthermore, the fine electrode lines can be formed with uniformity and improved precision of the widths and mutual distances thereof. Accordingly, fine-pitch electrodes of good quality can be mass-produced at a low cost.

Furthermore, the fine pitch electrode unit according to the present invention eliminates the necessity of an operation in which electrode lines are positioned one by one while connecting the fine-pitch electrode and the printed circuit board, or the necessity of the connecting operation itself. Accordingly, the fine pitch electrode unit according to the present invention provides significant effects which conventional units do not provide in that operability during maintenance or the like is improved.

BRIEF DESCRIPTION OF THE DRAWINGS

FIGS. 2 to 4, 5A, 5B, 6, 7, 8A, 8B, 9A, and 9B are illustrations showing a process for producing a fine-pitch electrode according to the first embodiment.

FIGS. 12A, 12B, and 12C show the third embodiment of the present invention; FIG. 12A is a partially omitted front view of a fine-pitch electrode unit, FIG. 12B is a right side view of the fine-pitch electrode unit in FIG. 12A, and FIG. 12C is a view from the end surface side of the fine-pitch electrode unit in FIG. 12A.

FIGS. 13A and 13B show the fourth embodiment of the present invention; FIG. 13A is a partially omitted front view of a fine-pitch electrode unit, and FIG. 13B is a right side view of the fine-pitch electrode unit in FIG. 13A.

DESCRIPTION OF THE PREFERRED EMBODIMENTS

A fine electrode line according to the present invention may have the cross-sectional shape of a quadrangle (square, rectangular) or any other kind of polygon. A coating film on the fine electrode line may preferably be formed from a highly rigid electrical insulator such as glass or ceramic.

Before or after any step in the process for producing a fine-pitch electrode, an end surface aligning step may be added in which the end surfaces of the above-described fine electrode lines are aligned on a common plane.

The fine electrode film cited above may be formed from a metal with good electrical conductivity such as copper. A laminate electrode film may comprise an electrically conductive component, such as Ni, Fe—Ni, and Fe—Ni—Cr, as a material. Alternatively, a laminate electrode film may comprise an electrically conductive component, such as Cu, Ag, Ni, and Au, as a material, and at the same time, a rigid film comprising a rigid component such as Fe—Ni—Cr may be provided on the surface of the tip of the fine electrode line comprising the laminate electrode film and the fine electrode film.

The thin film partial removal step in the process for producing a fine-pitch electrode can be implemented by ion etching or acid cleaning. A glass member composed of materials which are almost the same as those in the substrate may be used for the electrically insulating sealing member which is used when sealing in the fine electrode lines. Prior to the insulating material application step or the fine electrode line sealing-in step, an end surface rigid film formation step may be added in which the end surface at the tip of each fine electrode line is provided with a rigid film comprising a material which is more rigid than the fine electrode lines and which is a good electrical conductor. Alternatively, prior to the insulating material application step or the fine electrode line sealing-in step, an end surface film formation step may be added in which the end surface at the tip of each fine electrode line is provided with an end surface film comprising a material which is more thermally conductive than the fine electrode lines. Furthermore, alternatively, prior to the insulating material application step or the fine electrode line sealing-in step, an end surface film formation step may be added in which the end surface at the tip of each fine electrode line is provided with an end surface film comprising a material which has a melting point higher than that of the fine electrode lines.

Embodiments

Embodiments of the present invention will be explained below making reference to drawings.

First Embodiment

Figure 1:
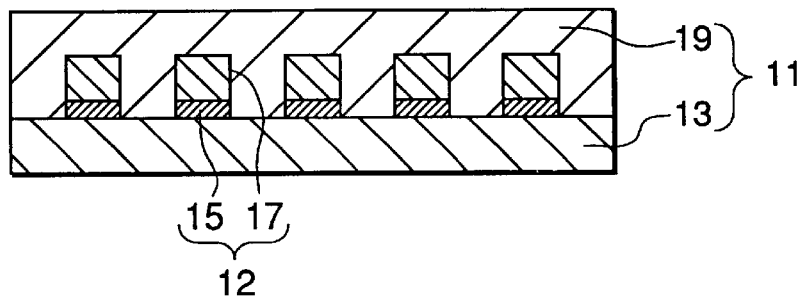
FIG. 1 is a schematic front view of a fine-pitch electrode according to the first embodiment of the present invention.

According to the first embodiment, a fine-pitch electrode 11 is produced by employing a sputtering technique, a plating technique, glass sealing technique, and the like. An example of the first embodiment is shown in FIG. 1. A procedure for producing the fine-pitch electrode is shown in FIGS. 2 to 4, 5A, 5B, 6, 7, 8A, 8B, 9A, and 9B.

Figure 16:
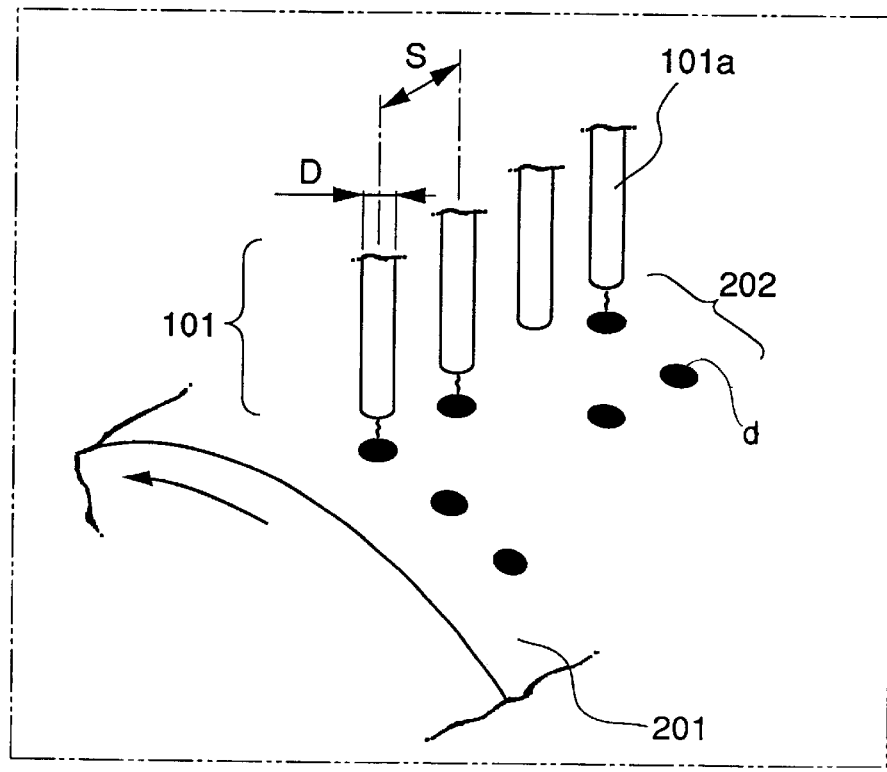
FIG. 16 is a schematic illustration showing the operation of each fine electrode line of the fine-pitch electrode shown in FIG. 15.

In FIG. 1, the fine-pitch electrode 11 comprises: a glass substrate 13; fine electrode lines 12 each of which comprises a fine electrode film 15 and a laminate electrode film 17, wherein the fine electrode films 15 are strips of electrically conductive thin films having a predetermined thickness and are disposed on the glass substrate 13 at predetermined intervals (for example, 30 to 300 μm), and the laminate electrode films 17 are electrically conductive members with which the fine electrode films 15 are laminated; and a sealing member 19 with which the glass substrate 13 is laminated and the entirety of the fine electrode lines 12 is covered and the spaces between the fine electrode lines 12 are filled. This fine-pitch electrode 11 is for use with the above-explained direct printing system (electronic image formation system) as a conventional example as shown in FIG. 16, and comprises a predetermined (plural) number of poles. Here, the glass substrate 13 may be replaced by a substrate made of another type of electrically insulating material such as a ceramic. These materials do not dissolve in a solvent contained in the ink, and thus the pitch of the fine electrode films 15 is not subject to change.

The above-described fine electrode films 15 can be formed of a metal with good electrical conductivity such as copper. In this embodiment, the fine electrode films 15 are formed to have a thickness of 2000 angstroms (0.2 µm) by a sputtering technique as explained below. Accordingly, lamination with the electrode films 17 and adhesion of the same become possible by a plating method, and an excellent laminate electrode films 17 can be obtained.

The laminate electrode films 17 may comprise an electrically conductive component, such as Ni, Fe—Ni, and Fe—Ni—Cr, as a material.

Figure 5A:
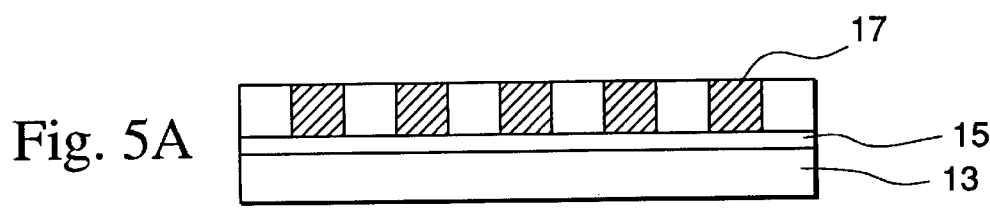
Figure 5B:
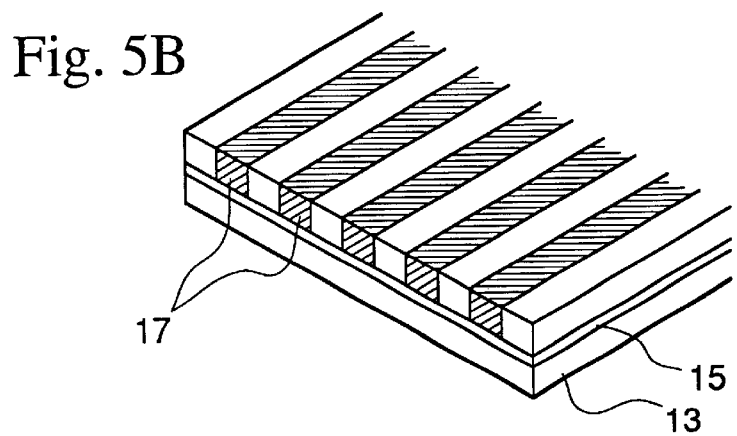
Figure 6:
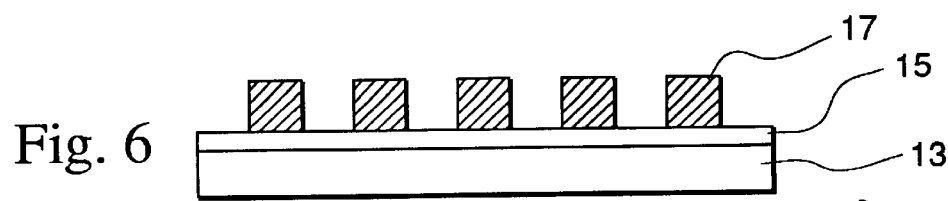
Figure 7:
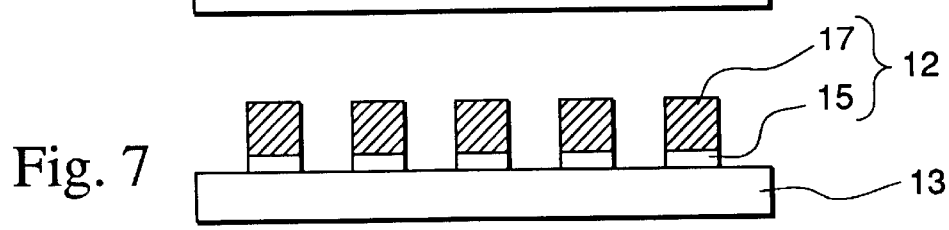
Figure 14A:
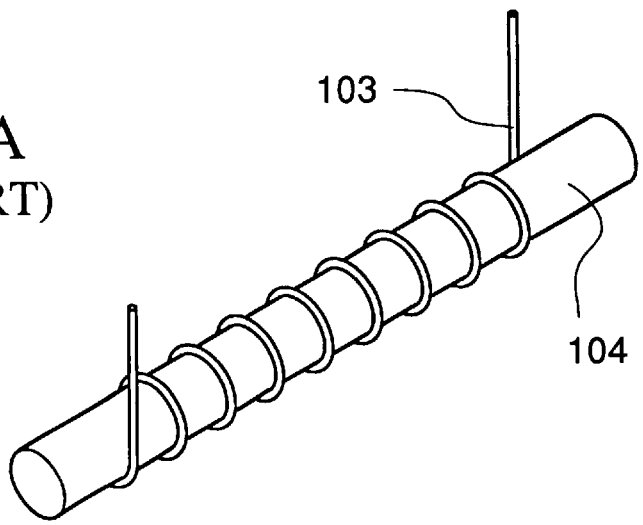
FIGS. 14A, 14B, 14C, and 14D are illustrations showing a process for producing a fine-pitch electrode according to a conventional example.
Figure 14B:
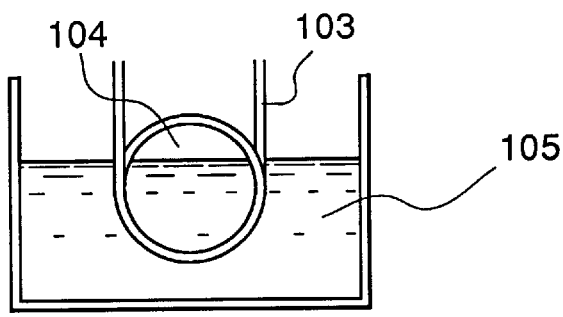
Figure 14C:
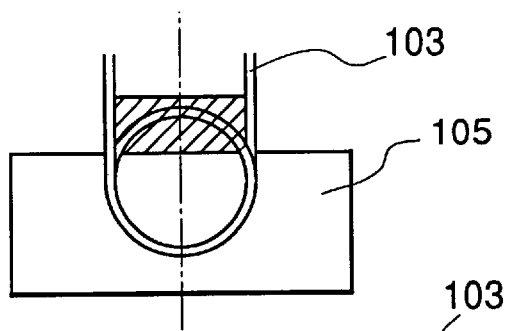
Figure 14D:
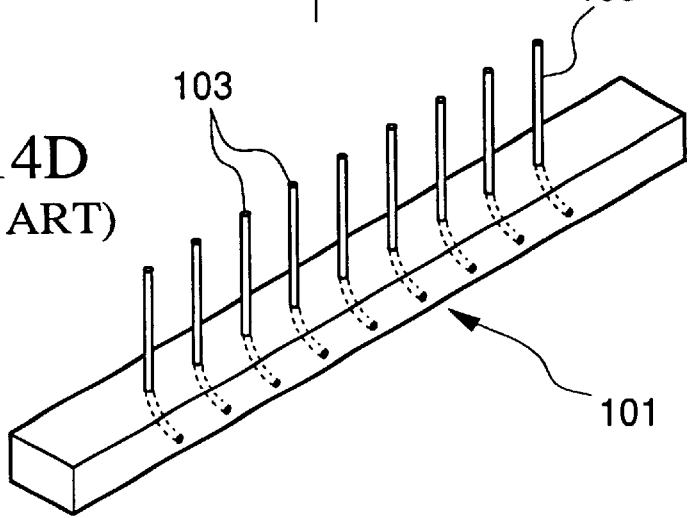
Figure 15:
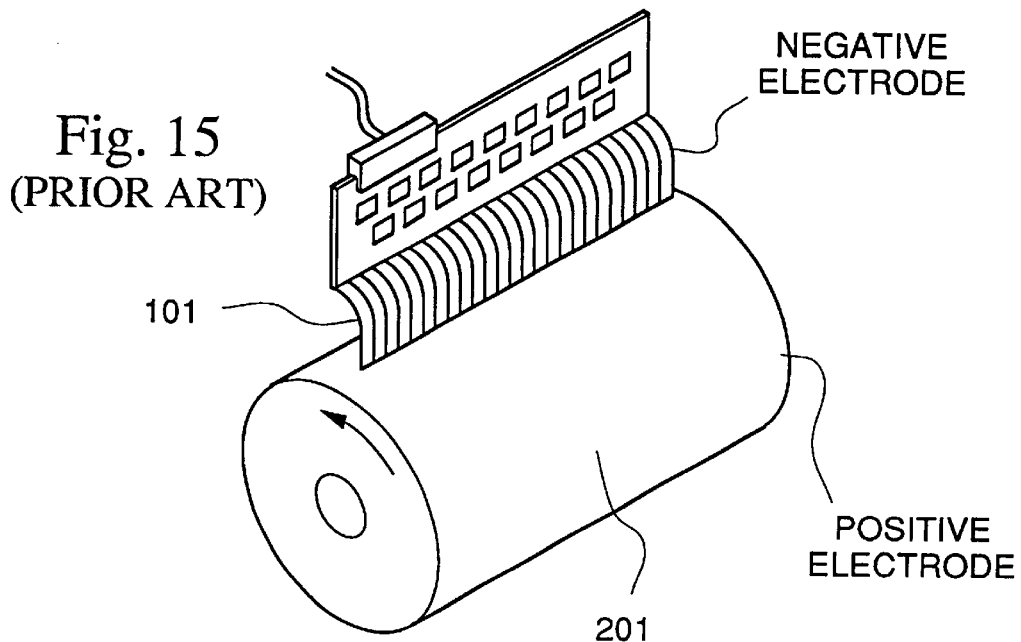
FIG. 15 is a schematic diagonal view showing an example of the use of the fine-pitch electrode of the conventional example.

Next, a process for producing the fine-pitch electrode 11 of the first embodiment will be explained, making reference to FIGS. 2 to 4, 5A, SB, 6, 7, 8A, 8B, 9A, and 9B. FIGS. 2 to 4, 5A, 6, 7, 8A, and 9A are views from the side of the surface to face a rotatable drum used in a direct printing system (end surface). FIGS. 5B, 8B, and 9B are diagonal views corresponding to FIGS. 5A, 8A, and 9A, respectively.

As shown in FIGS. 2 to 4, 5A, 5B, 6, 7, 8A, 8B, 9A, and 9B, the fine-pitch electrode 11 is formed via a thin film formation step (FIG. 2), a resist application step (FIG. 3), an exposure-development step (FIG. 4), a plating layer formation step (FIGS. 5A, 5B), a resist film removal step (FIG. 6), an electrode film base removal step (thin film partial removal step) (FIG. 7), an insulating material application step (FIGS. 8A and 8B), and s fine electrode line sealing-in step (FIGS. 9A and 9B).

The thin film formation step (cf. FIG. 2) is a step in which an electrically conductive thin film is formed from a material with good electrical conductivity such as copper (Cu) on the glass substrate 13 so as to serve as the fine electrode film base 15. The resist application step (cf. FIG. 3) is a step in which a resist is applied to the fine electrode film base 15 to form a resist layer 16 having a predetermined thickness.

Figure 2:
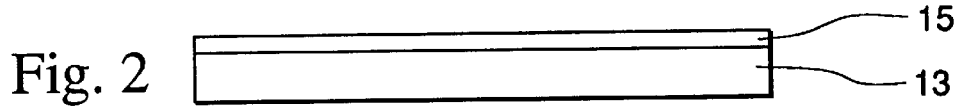
Figure 3:
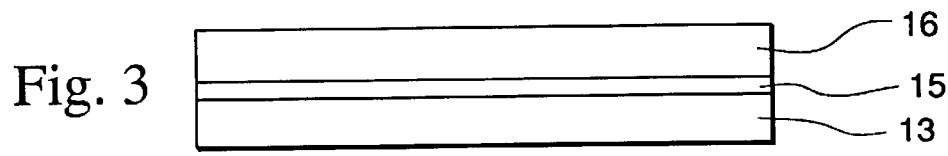
Figure 4:
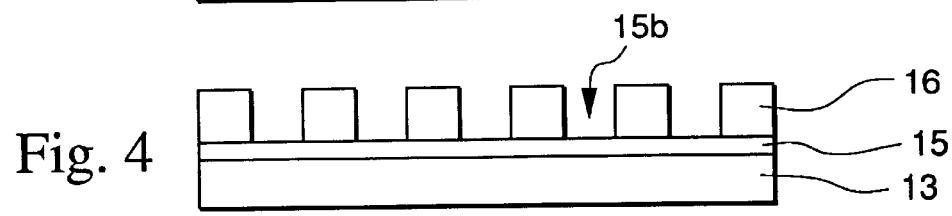

In the thin film formation step, as shown in FIG. 2, the fine electrode film base (underlayer) 15 having a predetermined thickness (for example, 2000 angstroms (0.2 µm)) as described above is formed on the glass substrate 13 according to a sputtering technique using copper as a material. The thickness of the resist layer 16 according to the resist application step (cf. FIG. 3) is adjusted to 20 to 100 µm. Instead of copper, Fe—Ni—Cr, Au, Ag, or the like may also be used.

The thickness of the resist layer 16 is adjusted in advance to be the same as the desired thickness of the laminate electrode film 17 to be formed by, for example, Fe—Ni plating. That is to say, the height of the fine electrode lines 12 are determined by the thickness of this resist layer 16.

After completion of the resist application step (cf. FIG. 3), the exposure-development step (cf. FIG. 4) follows. In this exposure-development step, an image is developed by exposing the resist layer 16 to light through a photomask (not shown in the drawings) in the shape of a grating having lines which have widths predetermined in advance and which are disposed at intervals predetermined in advance, whereby a resist film having a plurality of openings each of which has a width corresponding to the width of a fine electrode line 12 is formed. The inside surfaces (which are almost perpendicular to the upper surface of the substrate) of the openings and the upper surface of the fine electrode film base 15 define a plurality of recesses 15b. The exposure-development step may also be implemented by excising the opening portions with a cutter from an electrically insulating layer which is formed in place of the above resist layer. For example, a plurality of the recesses are formed by irradiating the electrically insulating layer with a laser to burn through it. Alternatively, the recesses 15b may be formed by an etching technique.

For the openings, an example is shown in which the inside surfaces are perpendicular to the upper surface of the substrate and in which the cross-section of each opening is in the shape of a square or a rectangle. However, by properly selecting the type of resist, inside surfaces forming slopes are obtainable. In this case, the cross-section will be trapezoidal.

After completion of this exposure-development step (cf. FIG. 4), the plating layer formation step follows (FIG. 5). In this plating layer formation step, a plating layer comprising a metallic material (for example, an electrically conductive material such as Ni, Fe—Ni, and Fe—Ni—Cr) is formed, so as to serve as the laminate electrode film 17, on the fine electrode film base 15 at the bottom of each recess 15b, which is uncovered by the exposure-development step, by filling up each recess 15b with the metallic material. The plating layers extend from the end surfaces facing the drum in a direction perpendicular to the surface of the drum. The pitch of the plating layers may be arbitrarily selected. Accordingly, the pitch may be easily adjusted for connectors to connect with an external circuit.

After completion of this plating layer formation step (cf. FIGS. 5A and 5B), the resist film removal step (cf. FIG. 6) follows.

The electrode film base removal step (thin film partial removal step) (cf. FIG. 7) follows, in which a portion of the fine electrode film base 15, which was on the bottom of the resist film, is removed.

Accordingly, a plurality of fine electrode lines 12, corresponding to a desired number of poles, are exposed. Here, the electrode film base removal step (thin film partial removal step) (cf. FIG. 7) may be implemented by an ion etching technique or, alternatively, silicic acid cleaning. According to this step, the fine electrode lines 12 are electrically separated from each other.

Subsequently, the insulating material application step (cf. FIGS. 8A and 8B) and fine electrode line sealing-in step (cf. FIGS. 9A and 9B) are carried out step by step.

The insulating material application step is a step in which a predetermined electrically insulating material 21 (for example, a glass material which is of the same type as the sealing member) is applied in the spaces between the fine electrode lines 12 while the plating layers (laminate electrodes films 17) are masked, whereby the above-described recesses 15b are filled. Instead of the masking, a liquid or powder may be applied to the front surfaces of the plating layers.

The fine electrode line sealing-in step (cf. FIGS. 9A and 9B) is a step in which, after completion of the insulating material application step, an electrically insulating sealing member (for example, a glass material or the like) is molded to cover the entirety of the fine electrode lines 12 except for the surface of one end at the tip and a part of the other end portion of each fine electrode line 12, so as to seal in the fine electrode lines 12. The surface of one end and the other end portion are uncovered (exposed) even after the sealing-in step. Namely, the one end is exposed to face the electrically conductive drum 22, whereby electricity can be carried to the electrically conductive drum 22 through the exposed surface. Reference numeral 19 indicates a sealing member formed from a material which is the same as the material of the above-described substrate 13.

In the first embodiment, since the fine electrode lines 12 are formed step by step and consecutively by such techniques as sputtering on an electrical insulator such as a glass substrate, exposure-development of a resist layer, plating, ion etching, and the like, the fine-pitch electrodes can be produced automatically and continuously. At the same time, the fine electrode lines 12 in the fine-pitch electrode 11 can be formed to have arbitrary widths and mutual distances. Furthermore, the fine electrode lines 12 can be formed with uniformity and improved precision of the widths and pitch thereof. Accordingly, fine-pitch electrodes 11 of good quality can be mass-produced at a low cost.

Second Embodiment

Figure 10:
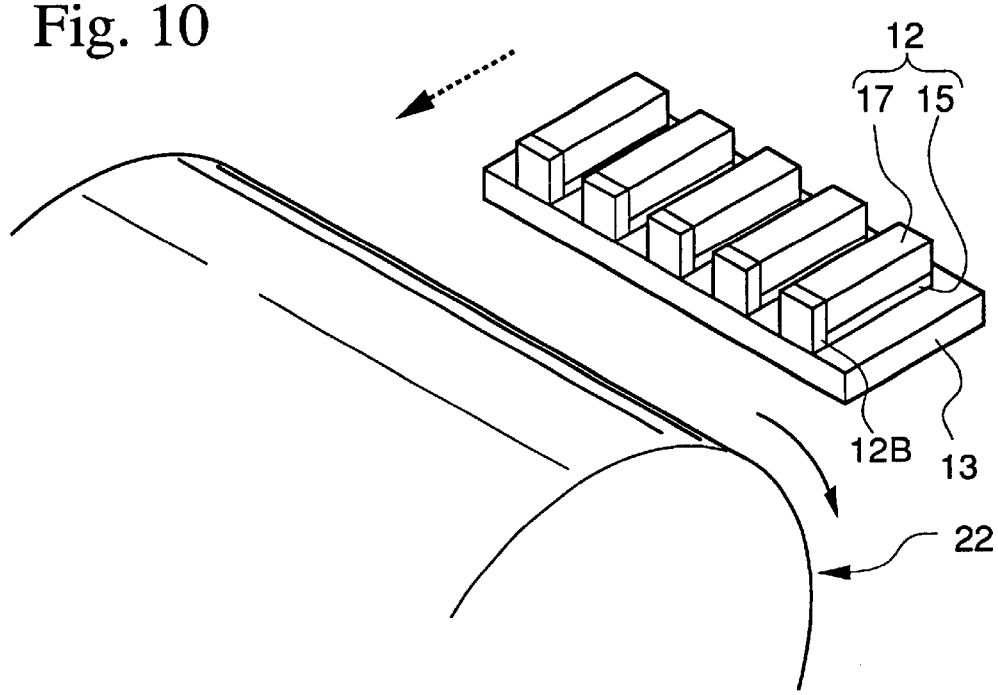
FIG. 10 is a partially omitted illustration showing end surface structures of the fine electrode lines according to the second embodiment of the present invention.
Figure 11:
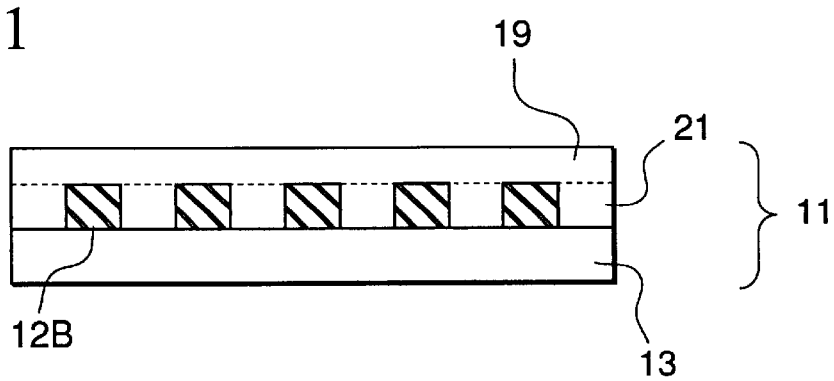
FIG. 11 is a schematic front view of a fine-pitch electrode according to the second embodiment of the present invention.

Next, a second embodiment will be explained making reference to FIGS. 10 and 11.

The second embodiment is characterized in that a part of each fine electrode line 12 is formed of a metal with good electrical conductivity such as copper (Cu), silver (Ag), gold (Au), nickel (Ni), or an alloy of some of these metals, and in that a rigid film 12B comprising, as a material, a rigid component with good electrical conductivity may be provided on the surface of an end at the tip of each fine electrode line 12 (the surface facing the surface of the metallic drum 22 in the vicinity thereof).

Here, a material such as Fe—Ni—Cr, Fe—Ni, and the like is used in the rigid film 12B in this embodiment. However, any other material may also be used, as long as it functions in a manner similar to the above materials. Alternatively, any other film which functions as the rigid film in a manner similar to the rigid film may also be formed. In order to have a film function in a manner similar to the rigid film, the characteristics of 1) a high thermal conductivity, 2) a high melting point, or 3) a low electrical resistance may be imparted to the electrode lines, so as to inhibit deterioration of the electrode lines due to the heat generated by the electrical resistance when electricity is running.

The end surface rigid film formation step for forming this rigid film 12B is incorporated into the process for forming a fine-pitch electrode according to the first embodiment prior to the insulating material application step (cf. FIGS. 8A and 8B) or the fine electrode line sealing-in step (cf. 9A and 9B). The end surfaces of the fine electrode lines may be immersed into a bath of Fe—Ni—Cr or Fe—Ni plating solution so as to plate only the end surfaces. Furthermore, subsequently, the plated end surfaces may be ground for smoothness.

The other part of the structure is the same as the above-described first embodiment.

The above structure also results in the same functions and effects as those according to the first embodiment. In addition, since the fine electrode lines 12 portion is formed of a metal with good electrical conductivity, such as copper (Cu), silver (Ag), gold (Au), nickel (Ni), and the like, the fine electrode lines 12 have low electrical resistance, and thus generation of heat can be effectively avoided. Because of this, as well as the enhanced abrasion resistance imparted by the rigid film 12B which is provided on the surface of the end at the tip of each fine electrode line 12, the second embodiment is advantageous in that durability can be enhanced.

Third Embodiment

Next, a third embodiment will be explained making reference to FIGS. 12A, 12B, and 12C.

The third embodiment is characterized in that a fine-pitch electrode 30A, which is equivalent to the fine-pitch electrode 11 in the first or second embodiment, is integrated with a printed circuit board 31 by directly forming the fine-pitch electrode 30A at an end of the printed circuit board 31.

In FIGS. 12A, 12B, and 12C, reference numeral 30 indicates a fine-pitch electrode unit. Reference numeral 35 indicates a driver provided outside the fine-pitch electrode unit 30. The fine-pitch electrode unit 30 comprises: a printed circuit board 31; a fine-pitch electrode 30A which is provided at an end of the printed circuit board 31, and which has a plurality of fine electrode lines 12, the end surfaces of which are uncovered and aligned on a common plane; connecting terminals 33 which serve as connectors which are provided on the printed circuit board 31, and which receive external driving currents for the fine electrode lines 12 from the external driver 35; and printed wiring 33 which electrically connects the fine electrode lines 12 and the connecting terminals 33 in an individually operable manner.

Here, as the fine-pitch electrode 30A, one constructed in a manner equivalent to the construction of the fine-pitch electrode 11 in FIG. 1 can be used as described above. Specifically, the fine-pitch electrode 30A can be constructed by, for example, laying fine electrode lines 12 between a glass layer which is a constituent of the printed circuit board 31 and another glass layer 36, applying the above-described production process of the first embodiment.

Accordingly, the third embodiment exhibits the same functions and effects as those of the first embodiment. In addition, the necessity of an operation for connecting the fine-pitch electrode 30A and the printed circuit board 31 is eliminated, and thus the third embodiment is advantageous in that the operability during maintenance or the like is improved.

In addition, the trouble of connecting the fine electrode lines 12 and the printed wiring 33 one by one can be saved by preparing the mask in such a manner that the widths and the pitch of the fine electrode lines 12 correspond to those of the printed wiring 33 in the vicinity of the connections between the fine electrode lines 12 and the printed wiring 33 which electrically connects the fine electrode lines 12 and the connecting terminals 32 as connectors which receive driving currents from the external driver 35.

Fourth Embodiment

Next, a fourth embodiment will be explained making reference to FIGS. 13A and 13B. The fourth embodiment shown in FIGS. 13A and 13B is characterized in that a fine-pitch electrode 11 as in the first embodiment is integrated by directly forming it at an end of a printed circuit board 41, which is equipped with a signal processing circuit (electrode driving circuit) or the like.

In FIGS. 13A and 13B, reference numeral 40 indicates a fine-pitch electrode unit. Reference numeral 45 indicates a driver provided outside the fine-pitch electrode unit 40. The fine-pitch electrode unit 40 comprises: a printed circuit board 41; a fine-pitch electrode 40A which is provided at an end of the printed circuit board 41, and which has a plurality of fine electrode lines 12, the end surfaces of which are uncovered and aligned on a common plane; an electrode driving circuit 42, such as an LSI, which is provided on the printed circuit board 41, and which drives the fine electrode lines 12 in response to external driving commands from an external driver 45; connectors 43 which are provided on the printed circuit board 41, and which receive the external driving commands for the electrode driving circuit 42 from the external driver 45; and printed wiring 44 which electrically connects the fine electrode lines 12, the electrode driving circuit 42, and the connectors 43 in an individually operable manner.

Here, as the fine-pitch electrode 40A, one constructed in a manner equivalent to the construction of the fine-pitch electrode 11 in FIG. 1 can be used.

Accordingly, the fourth embodiment exhibits the same functions and effects as those of the first and third embodiments. In addition, the necessity for an operation of connecting the fine-pitch electrode 40A and the printed circuit board 41 is eliminated, and thus the fourth embodiment is advantageous in that the operability during maintenance or the like of electrode driving circuit 42, in particular, or the like is improved.

It is noted that although each embodiment is explained with regard to a fine-pitch electrode which is used to equip a direct printing system (electronic image formation system), the present invention, as it is, is applicable to a fine-pitch electrode, having the same functions, which is used to equip an electronic apparatus other than the direct printing system.

Although the invention has been described in detail herein with reference to its preferred embodiments and certain described alternatives, it is to be understood that this description is by way of example only, and it is not to be construed in a limiting sense. It is further understood that numerous changes in the details of the embodiments of the invention, and additional embodiments of the invention, will be apparent to, and may be made by, persons of ordinary skill in the art with reference to this description. It is contemplated that all such changes and additional embodiments are within the spirit and true scope of the invention as claimed.

What is claimed is:

1. A process for producing a fine-pitch electrode, the process comprising:
   a thin film formation step in which an electrically conductive thin film base is formed on a substrate using an electrically conductive material;
   a step of forming a mask made of a resist film having openings at predetermined intervals, whereby a plurality of recesses are formed, each of which is defined by the inside surface of the opening and the upper surface of the electrically conductive thin film base;
   a plating layer formation step in which a plating layer comprising a metallic material is formed by plating on the electrically conductive thin film base at the bottom of each recess by filling up the recess;
   a resist film removal step in which the resist film is removed after the plating layer formation step;
   a thin film partial removal step, in which after the resist film removal step the electrically conductive thin film is removed leaving the electrically conductive thin film portions under the plating layers, so as to form a plurality of fine electrode lines each of which comprises the plating layer and the electrically conductive thin film portion;
   an insulating material application step in which an electrically insulating material is applied between a plurality of the fine electrode lines; and
   a fine electrode line sealing-in step in which, after completion of or at the same time as the insulating material application step, an electrically insulating sealing member is molded to cover the entirety of the fine electrode lines except for the surface of one end at the tip and a part of the other end portion of each fine electrode line, so as to seal in the fine electrode lines.

2. A process for producing a fine-pitch electrode according to claim 1, wherein the electrically conductive material comprises copper.

3. A process for producing a fine-pitch electrode according to claim 1, wherein the step of forming a mask comprises:
   a resist application step in which a resist is applied with a predetermined thickness to the electrically conductive thin film base; and
   an exposure-development step in which an image is developed by exposing the resist to light through a photomask in the shape of a grating having lines which have predetermined widths and which are disposed at predetermined intervals, whereby a resist film having a plurality of openings each of which has a width corresponding to the width of a fine electrode line is formed.

4. A process for producing a fine-pitch electrode according to claim 1, wherein the surface of an end of each fine electrode line is exposed after the fine electrode line sealing-in step so that the fine-pitch electrode can be provided in such a manner that the exposed surface faces a drum, whereby electricity can be carried to the drum through the exposed surface.

5. A process for producing a fine-pitch electrode, the process comprising:
   a thin film formation step in which an electrically conductive thin film base is formed on a substrate using an electrically conductive material;
   an insulating layer formation step in which an electrically insulating layer having a predetermined thickness is formed on the electrically conductive thin film base;
   an excision step in which some portions of the electrically insulating layer are excised using a cutting means through a mask member in the shape of a grating having lines which have predetermined widths and which are disposed at predetermined intervals, so as to form a plurality of recesses, each of which is defined by the inside surface of each excised portion and the upper surface of the electrically conductive thin film base;
   a plating layer formation step in which a plating layer comprising a metallic material is formed by plating on the electrically conductive thin film base at the bottom of each recess by filling up the recess;
   an insulating layer removal step in which the electrically insulating layer is removed after the plating layer formation step;
   a thin film partial removal step, in which after the insulating layer removal step the electrically conductive thin film is removed leaving the electrically conductive thin film portions under the plating layers, so as to form a plurality of fine electrode lines each of which comprises the plating layer and the electrically conductive thin film portion;
   a second insulating layer formation step in which second electrically insulating layers are formed between a plurality of the fine electrode lines; and
   a fine electrode line sealing-in step in which, after completion of or at the same time as the second insulating layer formation step, an electrically insulating sealing member is molded to cover the entirety of the fine electrode lines except for the surface of one end at the tip and a part of the other end portion of each fine electrode line, so as to seal in the fine electrode lines.

6. A process for producing a fine-pitch electrode according to claim 5, wherein the surface of an end of each fine electrode line is exposed after the fine electrode line sealing-in step so that the fine-pitch electrode can be provided in such a manner that the exposed surface faces a drum, whereby electricity can be carried to the drum through the exposed surface.

* * * * *